United States Patent
Kato et al.

(10) Patent No.: US 9,437,446 B2
(45) Date of Patent: Sep. 6, 2016

(54) SLURRY FOR CHEMICAL MECHANICAL POLISHING AND CHEMICAL MECHANICAL POLISHING METHOD

(71) Applicant: KURARAY CO., LTD., Kurashiki-shi (JP)

(72) Inventors: Mitsuru Kato, Kurashiki (JP); Chihiro Okamoto, Kurashiki (JP); Shinya Kato, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 14/404,528

(22) PCT Filed: May 27, 2013

(86) PCT No.: PCT/JP2013/064676
§ 371 (c)(1),
(2) Date: Nov. 28, 2014

(87) PCT Pub. No.: WO2013/180079
PCT Pub. Date: Dec. 5, 2013

(65) Prior Publication Data
US 2015/0147884 A1    May 28, 2015

(30) Foreign Application Priority Data
May 30, 2012   (JP) .................. 2012-123472

(51) Int. Cl.
| | |
|---|---|
| H01L 21/3105 | (2006.01) |
| C09G 1/02 | (2006.01) |
| H01L 21/762 | (2006.01) |
| B24B 37/24 | (2012.01) |
| C09K 3/14 | (2006.01) |

(52) U.S. Cl.
CPC ......... *H01L 21/31055* (2013.01); *B24B 37/24* (2013.01); *C09G 1/02* (2013.01); *C09K 3/1409* (2013.01); *H01L 21/31053* (2013.01); *H01L 21/762* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 2002/0045350 | A1 | 4/2002 | Kido et al. |
| 2004/0152309 | A1 | 8/2004 | Carter et al. |
| 2005/0118820 | A1 | 6/2005 | Akahori et al. |
| 2006/0205325 | A1* | 9/2006 | Abe .................. B01J 45/00 451/36 |
| 2007/0210278 | A1 | 9/2007 | Lane et al. |
| 2009/0317327 | A1 | 12/2009 | Pilgrimm |
| 2011/0039475 | A1 | 2/2011 | Hoshi et al. |

(Continued)

FOREIGN PATENT DOCUMENTS

| | | |
|---|---|---|
| EP | 1 274 123 A1 | 1/2003 |
| EP | 1 610 365 A1 | 12/2005 |

(Continued)

OTHER PUBLICATIONS

Bichsel Y, Von Gunten U; Environ Sci Technol 34: 2784-91 (2000).*

(Continued)

*Primary Examiner* — Allan Olsen
(74) *Attorney, Agent, or Firm* — Oblon, McClelland, Maier & Neustadt, L.L.P.

(57) ABSTRACT

The present invention provides a slurry for chemical mechanical polishing, containing abrasive grain (a), compound (b) having an amino group having a pKa of more than 9, and not less than 3 hydroxyl groups, and water.

15 Claims, 1 Drawing Sheet

(56) References Cited

U.S. PATENT DOCUMENTS

| | | | |
|---|---|---|---|
| 2011/0045741 A1 | 2/2011 | Ahn et al. | |
| 2011/0100956 A1* | 5/2011 | Keleher | C09G 1/02 216/37 |
| 2012/0048295 A1* | 3/2012 | Du | C11D 7/3245 134/3 |
| 2012/0129346 A1 | 5/2012 | Ryuzaki et al. | |

FOREIGN PATENT DOCUMENTS

| | | |
|---|---|---|
| JP | 2004-075859 A | 3/2004 |
| JP | 3649279 | 5/2005 |
| JP | 3672493 | 7/2005 |
| JP | 2006 520530 | 9/2006 |
| JP | 2007 273973 | 10/2007 |
| JP | 4021080 B | 10/2007 |
| JP | 2008 539581 | 11/2008 |
| KR | 10-2012-0024881 A | 3/2012 |
| WO | WO 2008/151918 A1 | 12/2008 |

OTHER PUBLICATIONS

International Search Report Issued Aug. 20, 2013 in PCT/JP13/064676 Filed May 27, 2013.

European Search Report with Search Opinion issued Dec. 7, 2015 in European Patent Application No. 13797707.0.

Database WPI Week 200429, Thomson Scientific, London, GB; AN 2004-308808, XP002751200.

* cited by examiner

SLURRY FOR CHEMICAL MECHANICAL POLISHING AND CHEMICAL MECHANICAL POLISHING METHOD

TECHNICAL FIELD

The present invention relates to a slurry for chemical mechanical polishing, which is preferable for the production of a semiconductor substrate, and a chemical mechanical polishing method using the slurry.

BACKGROUND ART

A semiconductor circuit has been made to show a high performance by high densification achieved by miniaturization of transistor, resistance, wiring and the like constituting a circuit, or simultaneously by high-speed responses. In addition, layering of wirings has enabled higher densification and higher integration. The semiconductor production techniques that have enabled the above include STI (Shallow Trench Isolation), planarization of an interlayer dielectric film, damascene process, and metal plug. STI is one of transistor element isolation, the damascene is one of an embedding technique of metal wiring and the metal plug is one of three-dimensional wiring using a metal having a structure penetrating an interlayer dielectric film. The technique essential for each step is CMP (Chemical Mechanical Polishing), which is constantly used for each step of STI formation, planarization of an interlayer dielectric film, damascene process and metal plug embedding. These fine patterns are formed by transcription of a resist mask formed by a photolithography step. As miniaturization proceeds, the depth of the focus of the projector lens used for the lithography becomes shallow, and the required level of flatness becomes high, since the concaves and convexes on the wafer needs to be smaller than the depth. By planarizing the worked surface by CMP, a flat surface of a nano order or atom level can be obtained, and high performance by three-dimensional wiring, i.e., layering, becomes possible.

In an STI formation step, after formation of a trench to be an element isolation region and formation of a polishing stop film on regions other than the groove, an insulating film for element isolation is formed inside the groove and on the polishing stop film. Then, an excess insulating film is removed by polishing by CMP until the polishing stop film appears, and planarized. As the stop film, silicon nitride is generally used and, as the insulating film, silicon oxide is often used.

For high planarization and element protection, it is necessary to decrease the rate of polishing the stop film and insulating film, when the stop film is exposed. To certainly expose the stop film on the entire surface of a wafer, a region on the wafer where the polishing rate is fast is polished for a comparatively long time even after exposure of the stop film. When the polishing rate of an insulating film is high even after exposure of the stop film, therefore, the insulating film on the concave part, which is an element isolation region (STI region), of the pattern is excessively removed (dishing phenomenon), and the property and reliability of the element decrease.

At present, for STI formation, a slurry containing ceria (cerium oxide) abrasive grain and an anionic polymer in combination is mainly used to achieve high planarization and to suppress polishing when polished excessively (e.g., patent documents 1 and 2). In addition, a system using an anionic polymer, and polyvinylpyrrolidone, a cationic compound and an ampholytic compound in combination is also known (e.g., patent document 3). Furthermore, a system using a low-molecular-weight compound selected from particular amino alcohol, amino carboxylic acid, hydroxycarboxylic acid and the like is also known (e.g., patent documents 4 and 5).

DOCUMENT LIST

Patent Documents patent document 1: JP-B-3672493
patent document 2: JP-B-3649279
patent document 3: JP-A-2007-273973
patent document 4: JP-A-2006-520530
patent document 5: JP-A-2008-539581

SUMMARY OF THE INVENTION

Problems to be Solved by the Invention

A STI region can be generally formed by the following steps. FIG. 1-FIG. 4 are schematic sectional views stepwisely showing STI formation steps in a production process of a semiconductor device. The size of each part in the drawings was set to facilitate understanding and the size ratio between each part and each part does not necessarily match the actual ratio.

Figure 1:
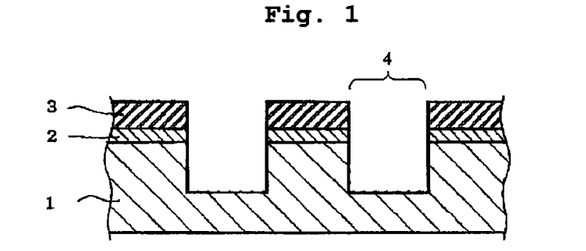
FIG. 1 is a schematic sectional view of a substrate having a trench formed by etching.
Figure 2:
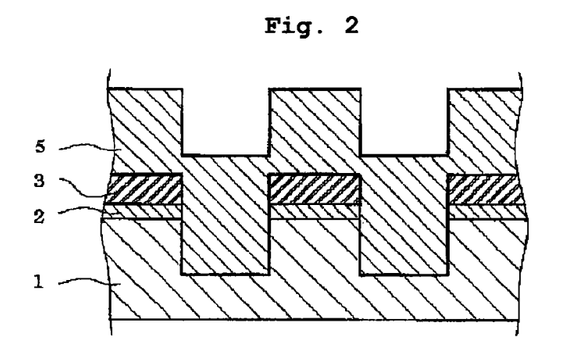
Figure 3:
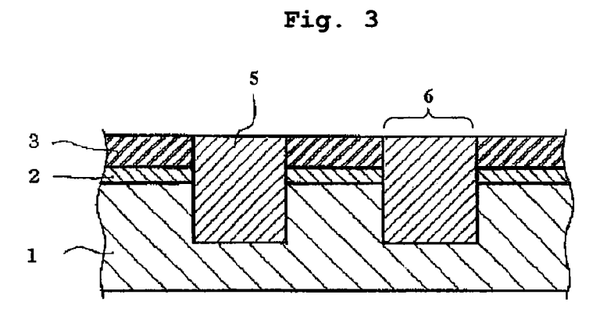
FIG. 3 is a schematic sectional view of a substrate having an insulating film polished by ideal CMP.
Figure 4:
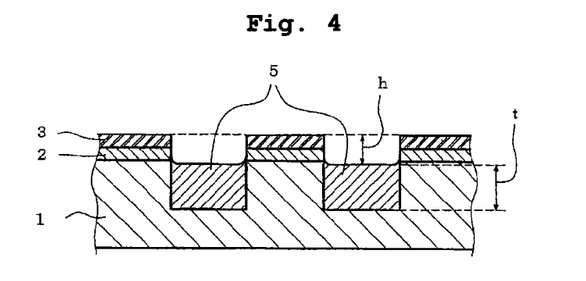
FIG. 4 is a schematic sectional view of a substrate having a step height produced by excessive polishing of an insulating film by CMP.

First, a stop film 3 is layered on an oxidized insulating film 2 (silicon oxide and the like) on the surface of substrate 1. Then, a resist film (not shown) is layered by photolithography on the substrate 1 on which oxidized insulating film 2 and stop film 3 are layered and, after etching, the resist film is removed to form a trench 4 (etched part) (FIG. 1). An insulating film 5 (silicon oxide and the like) is layered by CVD and the like to fill the trench 4 (FIG. 2). Then, a redundant insulating film 5 formed on the stop film 3 is removed by polishing by CMP to completely expose the stop film. In ideal polishing, the stop film 3 and the insulating film 5 embedded in the trench 4 to form an STI region 6 have no step height and are flat (FIG. 3).

Since the initial height of insulating film 5 varies on the stop film 3 and on the trench 4 (FIG. 2), and the polishing rate of the insulating film 5 is higher than that of the stop film 3, the insulating film filled in the trench 4 tends to be excessively removed when the insulating film 5 on the stop film 3 is removed by polishing. As a result, a step height h is generated between the stop film 3 and the insulating film 5 forming the STI region 6, and the film thickness t of the insulating film 5 for element isolation becomes thin (FIG. 4), due to which the reliability of a semiconductor element easily decreases.

Moreover, since a substrate has waviness and the distribution of slurry and pressure on the substrate are not completely uniform, it is actually difficult to uniformly polish the whole substrate. When a substrate polished to completely expose the entirety of the stop film 3 thereon, a problem occurs in that insulating film 5 filled in trench 4 is excessively polished (overpolishing) in a part of the stop film 3 which is exposed in an early stage. In the overpolished part, the step height further grows, and the film thickness of the insulating film 5 for element isolation also decreases further.

The slurries for chemical mechanical polishing described in patent documents 1-5 are not necessarily satisfactory to minimize the step height between an insulating film and a stop film. In addition, the slurry for chemical mechanical polishing described in patent document 5 sometimes fails to completely remove an insulating film on a stop film, and causes a defect in the element.

Accordingly, the present invention aims to provide a slurry for chemical mechanical polishing which is superior in an ability to planarizing the film to be polished (hereinafter sometimes to be abbreviated as "planarizing performance") and an ability to remove redundant insulating film, particularly, a slurry for chemical mechanical polishing (hereinafter sometimes to be abbreviated as "slurry for CMP"), which is capable of making the step height between an insulating film and a stop film extremely small in an STI formation step, and a chemical mechanical polishing method (hereinafter sometimes to be abbreviated as "CMP") using the slurry.

Means of Solving the Problems

The present inventors have conducted intensive studies and found that a slurry for chemical mechanical polishing, comprising abrasive grains (a) and compound (b) having an amino group having a pKa of more than 9 and not less than 3 hydroxyl groups (hereinafter sometimes to be abbreviated as "compound (b)") and water can achieve the abovementioned object, and completed the present invention below.

[1] A slurry for chemical mechanical polishing, comprising abrasive grain (a),
compound (b) having an amino group having a pKa of more than 9, and not less than 3 hydroxyl groups, and
water.
[2] The slurry of the aforementioned [1], wherein
the concentration of the aforementioned abrasive grain (a) is 0.1-20 mass %, and
the concentration of the aforementioned compound (b) is 0.001-1 mass %.
[3] The slurry of the aforementioned [1] or [2], wherein the aforementioned abrasive grain (a) is at least one selected from the group consisting of cerium oxide, manganese oxide, iron oxide, titanium oxide, magnesium oxide, zirconium oxide and tantalum oxide.
[4] The slurry of any of the aforementioned [1]-[3], wherein the pKa of the amino group of the aforementioned compound (b) is 9.2-10.5.
[5] The slurry of any of the aforementioned [1]-[4], wherein the number of the amino group of the aforementioned compound (b) is 1.
[6] The slurry of any of the aforementioned [1]-[5], wherein the aforementioned compound (b) has a molecular weight of 100-1000.
[7] The slurry of any of the aforementioned [1]-[6], wherein the aforementioned compound (b) is glucamine and/or a derivative thereof.
[8] The slurry of any of the aforementioned [1]-[7], further comprising a water-soluble polymer (c) at a concentration of 0.001-5 mass %.
[9] The slurry of the aforementioned [8], wherein the aforementioned water-soluble polymer (c) is an anionic polymer and/or a non-ionic polymer.
[10] The slurry of the aforementioned [8] or [9], wherein the aforementioned water-soluble polymer (c) is at least one selected from the group consisting of
a water-soluble polymer (c1) obtained by polymerizing 25-100 mass % of at least one monomer selected from the group consisting of (meth)acrylic acid, maleic acid, itaconic acid and vinylpyrrolidone, and 75-0 mass % of other monomer having an unsaturated double bond;
a water-soluble polymer (c2) obtained by polymerizing 50-100 mass % of a monomer that forms a vinyl alcohol skeleton by hydrolysis and 50-0 mass % of other monomer having an unsaturated double bond, which is followed by hydrolysis;
a water-soluble polysaccharide (c3);
a water-soluble polyurethane (c4) having a carboxy group and/or a polyoxyethylene group; and
a water-soluble derivative thereof (c5).
[11] The slurry of any of the aforementioned [1]-[10], further comprising a compound (d) having a structure shown by the formula (1) or (2) at a concentration of 0.0001-1 mass %

(1)

(2)

wherein $R^1$, $R^2$ and $R^3$ are each independently an alkylene group having 1-6 carbon atoms,
$R^4$ is a hydrogen atom or an alkyl group having 1-3 carbon atoms, and
n is an integer of 0-9.
[12] The slurry of the aforementioned [11], wherein the aforementioned compound (d) is at least one selected from the group consisting of iminodiacetic acid, N-(2-hydroxyethyl)iminodiacetic acid, aspartic acid-N,N-diacetic acid, nitrilotriacetic acid, N-(2-hydroxyethyl)ethylenediamine-N,N',N'-triacetic acid, ethylenediamine-N,N,N',N'-tetraacetic acid, propylenediamine-N,N,N',N'-tetraacetic acid, glycol etherdiamine-N,N,N',N'-tetraacetic acid, 1,2-diaminocyclohexane-N,N,N',N'-tetraacetic acid, diethylenetriamine-N,N,N',N'',N''-pentaacetic acid, triethylenetetramine-N,N,N',N'',N''',N'''-hexaacetic acid, 3-hydroxy-2,2'-iminodisuccinic acid and ethylenediamine disuccinic acid.
[13] The slurry of the aforementioned [2], wherein the aforementioned abrasive grain (a) is at least one selected from the group consisting of cerium oxide, manganese oxide, iron oxide, titanium oxide, magnesium oxide, zirconium oxide and tantalum oxide, and having an average particle size of 1-500 nm, and
the aforementioned compound (b) is at least one selected from the group consisting of glucamine, N-methylglucamine and N-ethylglucamine.
[14] The slurry of the aforementioned [13], wherein the aforementioned abrasive grain (a) is cerium oxide.
[15] The slurry of the aforementioned [13] or [14], wherein the aforementioned compound (b) is at least one selected from the group consisting of N-methylglucamine and N-ethylglucamine.
[16] The slurry of any of the aforementioned [13]-[15], wherein the concentration of the aforementioned abrasive grain (a) is 0.2-5 mass %.
[17] The slurry of any of the aforementioned [13]-[16], wherein the concentration of the aforementioned compound (b) is 0.004-0.4 mass %.
[18] The slurry of any of the aforementioned [13]-[17], further comprising a water-soluble polymer (c), which is at least one selected from the group consisting of polyacrylic acid, polyvinylpyrrolidone and pullulan and has a weight average molecular weight of 2,500-100,000, at a concentration of 0.001-5 mass %.

[19] The slurry of the aforementioned [18], wherein the aforementioned water-soluble polymer (c) has a concentration of 0.01-1 mass %.

[20] The slurry of any of the aforementioned [13]-[19], further comprising a compound (d), which is at least one selected from the group consisting of N-(2-hydroxyethyl) ethylenediamine-N,N',N'-triacetic acid, ethylenediamine-N,N,N',N'-tetraacetic acid and diethylenetriamine-N,N,N',N'',N''-pentaacetic acid, at a concentration of 0.0001-1 mass %.

[21] The slurry of the aforementioned [20], wherein the aforementioned compound (d) is ethylenediamine-N,N,N',N'-tetraacetic acid.

[22] The slurry of the aforementioned [20] or [21], wherein the aforementioned compound (d) has a concentration of 0.01-0.2 mass %.

[23] The slurry of any of the aforementioned [1]-[22], having pH 3-11.

[24] A method of chemical mechanical polishing, comprising polishing an insulating film by using the slurry of any of the aforementioned [1]-[23].

[25] The method of the aforementioned [24], which is used for forming a shallow trench isolation.

Effect of the Invention

According to the present invention, a slurry for chemical mechanical polishing, which is superior in the ability to planarize the film to be polished on a substrate and to remove a redundant insulating film can be provided, particularly, a slurry for chemical mechanical polishing, which can make a step height between an insulating film and a stop film extremely small in an STI formation step, and a chemical mechanical polishing method using the slurry can be provided.

BRIEF DESCRIPTION OF THE DRAWINGS

FIG. 2 is a schematic sectional view of a substrate having an insulating film layered by CVD and the like.

DESCRIPTION OF EMBODIMENTS

The slurry for CMP of the present invention contains an abrasive grain (a), a compound (b) having an amino group having a pKa of more than 9 and not less than 3 hydroxyl groups, and water as essential components.

[Abrasive Grain (a)]

As abrasive grain (a), any inorganic compound, organic compound or organic-inorganic composite material can be used. Examples thereof include cerium oxide, manganese oxide, iron oxide, titanium oxide, magnesium oxide, zirconium oxide, tantalum oxide, silicon oxide, aluminum oxide, tin oxide, diamond, fullerene, polystyrene and the like. Abrasive grain (a) is preferably at least one selected from the group consisting of cerium oxide, manganese oxide, iron oxide, titanium oxide, magnesium oxide, zirconium oxide and tantalum oxide, since they have a high polishing rate and are superior in the reduction of polishing scratches. Moreover, cerium oxide is particularly preferable as abrasive grain (a), since it shows further superior planarizing performance. Only one kind of abrasive grain (a) may be used or two or more kinds thereof may be used in combination.

The concentration of abrasive grain (a) in the slurry for CMP of the present invention is preferably 0.1-20 mass %, since the polishing rate, planarizing performance and abrasive grain dispersion stability become superior. It is more preferably 0.12-15 mass %, further preferably 0.15-10 mass %. When the content of abrasive grain (a) is less than 0.1 mass %, the polishing rate tends to decrease, and when the content exceeds 20 mass %, the polishing abrasive grains sometimes aggregate. From the aspects of polishing rate and suppression of polishing scratches, the content of the aforementioned polishing abrasive grain (a) is most preferably within the range of 0.2-5 mass %.

In addition, the average particle size of the abrasive grain (a) is preferably 1-500 nm, since the polishing rate becomes superior and the polishing scratches on the polished film becomes less. The average particle size of the abrasive grain (a) is more preferably 5-400 nm, further preferably 10-300 nm. When the average particle size is less than 1 nm, the polishing rate may decrease, and when the average particle size exceeds 500 nm, the polishing scratches occur easily. In the present specification, the average particle size of abrasive grain (a) can be measured by a particle size measurement apparatus "ELSZ-2" manufactured by Otsuka Electronics Co., Ltd. and analyzing same by a cumulant method.

[Compound (b)]

Compound (b) has an amino group having a pKa of more than 9, which is the common logarithm of the inverse number of the acid dissociation constant (Ka), and not less than 3 hydroxyl groups. Since the amino group of compound (b) has a pKa of more than 9, the planarizing performance of the slurry for CMP is markedly improved. The pKa of the amino group of compound (b) is more preferably 9.1-11, further preferably 9.2-10.5, particularly preferably 9.3-10. In the present invention, the pKa of the amino group of compound (b) is a value in water at 20° C. Such value of the pKa can be measured by the potentiometric titration method. In the present specification, the pKa of the amino group is "pKa of conjugated acid of the amino group". The slurry using compound (b) of the present invention for CMP affords a superior effect, and the mechanism thereof is considered to be as follows. Since the pKa of the amino group of compound (b) is within the above-mentioned range, the electrophilicity of the amino group protonated in water (i.e., conjugated acid of amino group) and nucleophilicity of the amino group are well-balanced. As a result, the adsorption strength of compound (b) to the film to be polished becomes appropriate, and low adsorptivity to a pattern convex part and a film without a pattern and high adsorptivity to a pattern concave part can be achieved simultaneously at a high level under normal polishing conditions. Using the slurry for CMP of the present invention, remarkable planarizing performance can be afforded at a particular pattern, as well as a plurality of patterns having different sizes and densities, including convex parts and concave parts, can be planarized uniformly in a short time with an extremely small step height, without leaving an unnecessary film. However, the present invention is not limited to such assumed mechanism.

The number of the amino group having a pKa of more than 9 of compound (b) is preferably 1 or 2 from the aspects of the stability of slurry and suppression of polishing scratches. It is particularly preferably 1. In addition, the amino group having a pKa of more than 9 of compound (b) is preferably primary or secondary, since the planarizing performance becomes superior. It is particularly preferably secondary.

The number of the hydroxyl groups of compound (b) needs to be not less than 3 for the improvement of the planarizing performance. The number of the hydroxyl groups of compound (b) is preferably 4-20, since the polishing rate and planarizing performance become further superior. It is more preferably 5-10.

The molecular weight of compound (b) is preferably 100-1000, since the polishing rate and planarizing performance become superior. When the molecular weight is less than 100, the planarizing performance tends to decrease, whereas when it exceeds 1000, the polishing rate and polishing uniformity tend to decrease. The molecular weight of compound (b) is more preferably 120-800, further preferably 140-600, particularly preferably 160-400.

Compound (b) preferably has one amino group and not less than 4 hydroxyl groups, wherein pKa of the amino group is more than 9, which is more preferably glucamine and/or a derivative thereof. As glucamine and a derivative thereof, any of a D form, an L form and a mixture thereof can be used. In view of availability, a D form thereof is preferable. Examples of the derivative of glucamine include N-methylglucamine, N-ethylglucamine, N-butylglucamine, N-octylglucamine and the like. From the aspects of availability and stability of the slurry, at least one selected from the group consisting of glucamine, N-methylglucamine and N-ethylglucamine is preferably used as compound (b), and at least one selected from the group consisting of N-methylglucamine and N-ethylglucamine is more preferably used. Only one kind of compound (b) may be used or two or more kinds thereof may be used in combination.

The concentration of compound (b) in the slurry for CMP of the present invention is preferably 0.001-1 mass %, since the polishing rate and planarizing performance become superior. The concentration of compound (b) is more preferably 0.002-0.8 mass %, further preferably 0.003-0.6 mass %, particularly preferably 0.004-0.4 mass %.

[Optional Component]

The slurry for CMP of the present invention may further contain a water-soluble polymer (c) (hereinafter sometimes to be abbreviated as "polymer (c)") as an optional component. Only one kind of polymer (c) may be used or two or more kinds thereof may be used in combination.

The polishing rate and planarizing performance can be further improved by the presence of polymer (c). In the present invention, being "water-soluble" means that the solubility in water at 20° C. is not less than 1 g/L.

Polymer (c) is preferably an anionic polymer and/or a non-ionic polymer, since the polishing rate and planarizing performance become superior. In the present invention, the anionic polymer means a polymer having an anionic functional group which is charged negative when dissolved in water (e.g., carboxy group after dissociation of proton), and the non-ionic polymer means a polymer free of an anionic functional group which is charged negative when dissolved in water and a cationic functional group which is charged positive when dissolved in water.

Polymer (c) is preferably at least one selected from the group consisting of a water-soluble polymer (c1) obtained by polymerizing 25-100 mass % of at least one monomer selected from the group consisting of (meth)acrylic acid, maleic acid, itaconic acid and vinylpyrrolidone, and 75-0 mass % of other monomer having an unsaturated double bond (e.g., methyl(meth) acrylate, ethyl(meth)acrylate, 2-hydroxyethyl(meth)acrylate, (meth)acrylamide, N,N-dimethyl(meth)acrylamide, styrene, methyl vinyl ether, vinylpyrrolidone, ethylene, propylene, butadiene etc.);

a water-soluble polymer (c2) obtained by polymerizing 50-100 mass % of a monomer that forms a vinyl alcohol skeleton by hydrolysis (e.g., vinyl acetate, vinyl propionate, vinyl butyrate, vinyl pivalate, vinyl caproate etc.) and 50-0 mass % of other monomer having an unsaturated double bond (e.g., methyl(meth)acrylate, ethyl(meth)acrylate, 2-hydroxyethyl(meth)acrylate, (meth)acrylamide, N,N-dimethyl (meth)acrylamide, styrene, methyl vinyl ether, vinylpyrrolidone, ethylene, propylene, butadiene etc.), which is followed by hydrolysis;

water-soluble polysaccharide (c3) (e.g., dextrin, dextran, pullulan, inulin, hydroxyethylcellulose, hydroxypropylcellulose etc.);

water-soluble polyurethane (c4) having a carboxy group and/or a polyoxyethylene group (e.g., polymer obtained by reacting a carboxy group-containing compound such as dimethylolpropionic acid, dimethylolbutanoic acid, aminobutyric acid, aminocaproic acid and the like and/or polyethylene glycol, and a diisocyanate compound such as hexamethylene diisocyanate, isophorone diisocyanate and the like); and a water-soluble derivative thereof (c5) (e.g., water-soluble polymer wherein at least a part of the carboxy group of the above-mentioned (c1)-(c4) is esterified, water-soluble polymer wherein at least a part of the hydroxyl group of the above-mentioned (c1)-(c4) is esterified, water-soluble polymer wherein at least a part of the hydroxyl group of the above-mentioned (c1)-(c4) is alkyl etherified).

In the present invention, "(meth)acrylic acid" and the like mean "methacrylic acid and acrylic acid" and the like, and "(meth)acrylamide" and the like mean "methacrylamide and acrylamide" and the like.

In the present invention, "polyoxyethylene group" means a group wherein not less than 4 (preferably 4-200, more preferably 8-100) oxyethylene groups ($-OC_2H_4-$) are bonded.

Polymer (c) is more preferably at least one selected from the group consisting of a water-soluble polymer (c1) obtained by polymerizing 25-100 mass % of at least one monomer selected from the group consisting of (meth)acrylic acid, maleic acid, itaconic acid and vinylpyrrolidone, and 75-0 mass % of other monomer having an unsaturated double bond;

at least one water-soluble polysaccharide (c6) selected from the group consisting of dextran and pullulan; and a derivative (c7) thereof (e.g., water-soluble polymer wherein at least a part of the carboxy group of the above-mentioned (c1) or (c6) is esterified, water-soluble polymer wherein at least a part of the hydroxyl group of the above-mentioned (c1) or (c6) is esterified, water-soluble polymer wherein at least a part of the hydroxyl group of the above-mentioned (c1) or (c6) is alkyl etherified). Such polymer (c) shows a particularly high improving effect on the polishing rate and the planarizing performance, and exhibits a synergistic effect by a combined use of the abrasive grain (a) and compound (b).

Polymer (c) is still more preferably at least one selected from the group consisting of a polymer obtained by polymerizing 50-100 mass % of at least one monomer selected from the group consisting of (meth)acrylic acid and vinylpyrrolidone and 50-0 mass % of other monomer having unsaturated double bond, dextran and pullulan, further more preferably at least one selected from the group consisting of polyacrylic acid, polyvinylpyrrolidone and pullulan, and even more preferably at least one selected from the group consisting of polyacrylic acid and polyvinylpyrrolidone.

Polymer (c) is particularly preferably polyacrylic acid or polyvinylpyrrolidone, most preferably polyacrylic acid.

When polymer (c) has an acidic functional group such as carboxy group and the like, the acidic functional group may be partially or entirely in the form of a salt.

The weight average molecular weight (Mw) of polymer (c) is preferably 1,000-1,000,000. When Mw is less than 1,000, the planarizing performance-improving effect of polymer (c) tends to decrease. On the other hand, when Mw exceeds 1,000,000, the slurry for CMP has a higher viscosity, the polishing rate and polishing uniformity may easily decrease, and the abrasive grains may easily aggregate. Mw of polymer (c) is more preferably 1,500-500,000, further preferably 2,000-200,000, particularly preferably 2,500-100,000. Mw of polymer (c) can be measured by connecting GPC column ("GMPWXL" manufactured by Tosoh Corporation) to a GPC apparatus ("150C" manufactured by Waters), and measuring Mw by using 200 mM aqueous phosphate solution as a mobile phase and polyethylene glycol or polyethylene oxide as a standard substance.

The concentration of polymer (c) in the slurry for CMP of the present invention is preferably 0.001-5 mass %, since the polishing rate and planarizing performance become superior. The concentration of polymer (c) is more preferably 0.005-3 mass %, further preferably 0.01-1 mass %, particularly preferably 0.02-0.5 mass %.

The slurry for CMP of the present invention may further contain, as an optional component, a compound (d) having a structure shown by the aforementioned formula (1) or (2) (hereinafter sometimes to be abbreviated as "compound (d)"). Only one kind of compound (d) may be used or two or more kinds thereof may be used in combination.

The planarizing performance and pattern-uniformizing performance of the slurry for CMP can be further improved by the presence of compound (d). Here, the pattern-uniformizing performance in the present invention means an ability to suppress inconsistency in the polished amount of different wafer patterns. The carboxy group possessed by compound (d) may be partially or entirely in the form of a salt.

$R^1$, $R^2$ and $R^3$ in the aforementioned formulas (1) and (2) (i.e., compound (d)) are each independently an alkylene group having 1-6 (preferably 1-3) carbon atoms (preferably a methylene group, an ethylene group, a trimethylene group [—$(CH_2)_3$—], a propylene group [—$CH(CH_3)CH_2$— or —$CH_2CH(CH_3)$—]). $R^4$ is a hydrogen atom or an alkyl group having 1-3 carbon atoms (more preferably a methyl group or an ethyl group), and n is an integer of 0-9 (preferably 0-5).

Compound (d) is preferably at least one selected from the group consisting of iminodiacetic acid, N-(2-hydroxyethyl) iminodiacetic acid, aspartic acid-N,N-diacetic acid, nitrilotriacetic acid, N-(2-hydroxyethyl)ethylenediamine-N,N',N'-triacetic acid, ethylenediamine-N,N,N',N'-tetraacetic acid, propylenediamine-N,N,N',N'-tetraacetic acid, glycol etherdiamine-N,N,N',N'-tetraacetic acid, 1,2-diaminocyclohexane-N,N,N',N'-tetraacetic acid, diethylenetriamine-N,N,N',N'',N''-pentaacetic acid, triethylenetetramine-N,N,N',N'',N''',N'''-hexaacetic acid, 3-hydroxy-2,2'-iminodisuccinic acid and ethylenediamine disuccinic acid.

Compound (d) is more preferably at least one selected from the group consisting of N-(2-hydroxyethyl)ethylenediamine-N,N',N'-triacetic acid, ethylenediamine-N,N,N',N'-tetraacetic acid and diethylenetriamine-N,N,N',N'',N''-pentaacetic acid, particularly preferably ethylenediamine-N,N,N',N'-tetraacetic acid.

When compound (d) is further contained in the slurry for CMP of the present invention, the concentration thereof is preferably 0.0001-1 mass %, since the planarizing performance and pattern-uniformizing performance become superior. It is more preferably 0.001-0.5 mass %, further preferably 0.005-0.3 mass %, particularly preferably 0.01-0.2 mass %.

The pH of the slurry for CMP of the present invention is preferably 3-11, since the polishing rate, planarizing performance and stability of the slurry for CMP become superior. It is more preferably 4-10. The pH of the slurry for CMP of the present invention can be adjusted by adding to the slurry, for example, a base such as potassium hydroxide, sodium hydroxide, tetramethylammonium hydroxide, 2-hydroxyethyltrimethylammonium hydroxide, ammonia, trimethylamine, triethylamine, ethylenediamine, diethylenetriamine, N,N,N',N'-tetramethylethylenediamine, N,N-dimethylethanolamine, N,N-dibutylethanolamine, N-methyldiethanolamine, N-butyldiethanolamine, triethanolamine, 2-(2-aminoethylamino)ethanol, 1-(2-hydroxyethyl)piperazine, imidazole and the like; acid such as hydrochloric acid, nitric acid, sulfuric acid, acetic acid, citric acid, malic acid, phthalic acid, gluconic acid and the like; amino acid such as glycine, alanine, glutamic acid, aspartic acid and the like; chelating agents such as dihydroxyethylglycine and the like; and the like.

The slurry for CMP of the present invention may further contain a cationic polymer, an ampholytic polymer, a surfactant, a dispersing agent, an antibacterial agent, an oxidant, a reducing agent, a water-soluble organic solvent and the like within the range that does not inhibit the effect of the present invention.

The slurry for CMP of the present invention is suitable for planarizing concave and convex patterns formed on an insulating film, and particularly useful for planarizing an insulating film by polishing to form a shallow trench isolation (STI) by CMP. The slurry for CMP of the present invention is extremely superior in the planarizing performance since the polishing rates of both the stop film and the insulating film decrease at the time point the stop film is exposed. Examples of the stop film include a silicon nitride film, a polysilicon film and the like. The slurry for CMP of the present invention is preferably used for CMP wherein the stop film is a silicon nitride film and the insulating film is a silicon oxide film, since the effect of the present invention is exhibited further. The slurry for CMP of the present invention may also be used for CMP of a silicon oxide film which is denatured by a small amount of boron, phosphorus, carbon, fluorine and the like.

A known means can be used for CMP using the slurry for CMP of the present invention. As CMP using a known means, for example, a method including pressing a wafer having a film to be polished formed thereon against a surface of a polishing pad adhered onto a polishing platen, while supplying the slurry for CMP of the present invention, pressurizing same, and rotating both the polishing platen and the wafer to polish the film to be polished can be mentioned. A polishing pad usable for CMP in the present invention is not particularly limited, and any of foamed resin, unfoamed resin, non-woven fabric and the like can be used. It may be a single layer pad composed only of a polishing layer, or a two-layer structure pad provided with a cushion layer under a polishing layer. As a method for supplying the slurry for CMP of the present invention on a polishing pad, the slurry may be fed as a single liquid containing all components, or plural liquids containing each component may be fed and mixed in a piping or on a pad to a desired concentration. It is also possible to appropriately change the kind and concentration of each component during polishing.

EXAMPLES

The present invention is explained in more detail in the following by referring to Examples, which are not to be construed as limitative. The polishing performance was evaluated by the following methods.

[pH of Slurry for CMP]

Using a pH meter "F-22" manufactured by Horiba, Ltd. and a standard buffer (phthalate pH buffer: pH 4.00 (25° C.), neutral phosphate pH buffer: pH 7.00 (25° C.), borate pH buffer: pH 9.00 (25° C.)), three-point calibration was performed and the pH of a slurry for CMP was measured at a controlled temperature of 25° C.

[Measurement of Thickness of Silicon Oxide Film and Silicon Nitride Film]

Using a thickness measuring apparatus "Nanospec Model 5100" manufactured by Nanometric, the thickness of silicon oxide film and silicon nitride film was measured with an objective lens at 10-fold magnification.

[Measurement of Step Height of Patterned Wafer]

Using a surface-roughness measuring apparatus "SJ-400" manufactured by Mitutoyo Corporation, the measurement was performed under the setting of standard stylus, measurement range 80 μm, JIS 2001, GAUSS filter, cutoff value λc 2.5 mm, and cutoff value λs 8.0 μm, and the step height of a patterned wafer was determined from a primary profile.

[Evaluation of Patterned Wafer Polishing Performance]

A polishing pad "IC1400 (concentric circular grooves); diameter 380 mm" manufactured by Nitta Haas Incorporated was adhered to a polishing platen of a polishing apparatus "BC-15" manufactured by MAT Ltd. Using a diamond dresser (diamond No. #100; diameter 190 mm) manufactured by A.L.M.T. Corp., the surface of the polishing pad was ground at dresser rotation 140 rpm, polishing pad rotation 100 rpm, dresser load 5N for 60 min while flowing pure water at a rate of 150 mL/min (hereinafter to be referred to as "conditioning").

Then, a silicon wafer (diameter 2 inch) having a 1000 nm-thick unpatterned silicon oxide film (PETEOS silicon oxide film formed by plasma chemical vapor deposition) on its surface was polished, without conditioning, for 60 sec under the conditions of polishing pad rotation 100 rpm, wafer rotation 99 rpm, and polishing pressure 24 kPa, while supplying a polishing slurry at a rate of 120 mL/min. Then, after conditioning for 30 sec, the wafer was exchanged, polishing and conditioning were repeated, and total ten wafers were polished.

Then, one patterned wafer for STI polishing evaluation "SKW3-2" manufactured by SKW, which has a concave convex pattern formed by alternately and repeatedly arranged linear convex parts and concave parts, was polished under the same conditions as above. The patterned wafer has regions with various patterns, and the following regions with patterns (i)-(v) were selected as the measurement targets of film thickness and step height. While pattern (ii) is present in plural parts in the wafer, one adjacent to pattern (i) located at about 9 mm from the center of the wafer was used as the measurement target.

pattern (i): pattern with convex part width 100 μm and concave part width 100 μm pattern (ii): pattern with convex part width 50 μm and concave part width 50 μm pattern (iii): pattern with convex part width 500 μm and concave part width 500 μm pattern (iv): pattern with convex part width 70 μm and concave part width 30 μm pattern (v): pattern with convex part width 30 μm and concave part width 70 μm All the above-mentioned patterns have an initial step height between the convex part and the concave part thereof of about 500 nm. The convex part of the pattern has a structure wherein a 13 nm-thick silicon oxide film is layered on a silicon wafer, a 110 nm-thick silicon nitride film is layered thereon, and a 670 nm-thick silicon oxide film (HDP silicon oxide film formed by high density plasma chemical vapor deposition) is layered thereon, and the concave part of the pattern has a structure wherein a 670 nm-thick HDP silicon oxide film is formed on a groove formed by etching the silicon wafer by 400 nm.

In polishing of a patterned wafer, the time point when the silicon oxide film on the convex part silicon nitride film of pattern (i) disappears by polishing was taken as "just polishing", and the film thickness of silicon oxide film and silicon nitride film and step height of pattern (i) on just polishing were measured. Thereafter, the patterned wafer was further polished for the time corresponding to 30% of the polishing time required for just polishing to perform an overpolished model test, and the film thickness and step height of pattern (i) were measured again, and the film thickness of patterns (ii)-(v) was measured.

In pattern (i), a smaller film thickness decrement and a smaller step height increment during overpolishing are preferable, since superior planarizing performance is obtained.

In addition, a smaller difference in the film thickness of each pattern after overpolishing is preferable since it shows uniform polishing irrespective of the pattern shape.

Moreover, the difference in the film thickness of the concave parts in pattern (ii) and pattern (iii) (i.e., [film thickness of concave part in pattern (ii)]-[film thickness of concave part in pattern (iii)]) was evaluated as "pattern size dependent performance", and the difference in the film thickness of the concave parts in pattern (iv) and pattern (v) (i.e., [film thickness of concave part in pattern (iv)]-[film thickness of concave part in pattern (v)]) was evaluated as "pattern density dependent performance". A smaller value is more preferable for both of them.

Example 1

Cerium oxide abrasive grain (50 g, abrasive "GPL-C1010" manufactured by Showa Denko K.K., stock solution concentration 10 mass %, average particle size 200 nm), N-methylglucamine (0.5 g, manufactured by Wako Pure Chemical Industries, Ltd.), polyacrylic acid (2.5 g, manufactured by Wako Pure Chemical Industries, Ltd., weight average molecular weight 5,000) and pure water (900 g) were uniformly mixed, and 28 mass % aqueous ammonia (manufactured by Wako Pure Chemical Industries, Ltd.) and pure water were added to prepare 1000 g of slurry for CMP having pH 5.0. The concentration of abrasive grain (a) (cerium oxide abrasive grain) in the slurry was 0.5 mass %, the concentration of compound (b) (N-methylglucamine) was 0.05 mass %, and the concentration of polymer (c) (polyacrylic acid) was 0.25 mass %.

The patterned wafer polishing performance was evaluated. As a result, as shown in Table 2, the slurry for CMP of Example 1 showed a very small concave part film thickness decrement of 17 nm, a very small step height increment of 15 nm in pattern (i) during overpolishing, and was extremely superior in the polishing suppressive effect and planarizing performance during overpolishing. As shown in Table 2, the pattern size dependent performance and pattern density dependent performance were small at 6 nm and 23 nm, respectively, and the slurry was also superior in the pattern-uniformizing performance.

Examples 2-6

In the same manner as in Example 1 except that the component and concentration of the slurry for CMP were changed as shown in Table 1, slurries for CMP were prepared. The pH of each slurry was as shown in Table 1, and aqueous ammonia or hydrochloric acid was used for adjustment.

The polishing performance of a patterned wafer was evaluated. As a result, as shown in Table 2, the slurries for CMP of Examples 2-6 showed a small step height increment and a small concave part film thickness decrement of pattern (i) during overpolishing, and were extremely superior in the polishing suppressive effect and planarizing performance during overpolishing. Furthermore, as shown in Table 2, the slurries showed small pattern size dependent performance and small pattern density dependent performance, and were also superior in the pattern-uniformizing performance.

Comparative Example 1-6

In the same manner as in Example 1 except that the component and concentration of the slurry for CMP were changed as shown in Table 3, slurries for CMP were prepared. The pH of each slurry is as shown in Table 3, and aqueous ammonia or hydrochloric acid was used for adjustment.

The patterned wafer polishing performance was evaluated. As a result, as shown in Table 4, the slurries for CMP of Comparative Examples 1-6 showed a high step height increment and a high concave part film thickness decrement of pattern (i) during overpolishing, and were inferior in the polishing suppressive effect and planarizing performance during overpolishing. Furthermore, as shown in Table 4, the slurry showed high pattern size dependent performance and high pattern density dependent performance in Comparative Example 1. The slurries showed high pattern density dependent performance in Comparative Examples 4-6. They were inferior in the pattern-uniformizing performance.

Comparative Examples 7-12

In the same manner as in Example 1 except that the component and concentration of the slurry for CMP were changed as shown in Table 5, slurries for CMP were prepared. The pH of each slurry is as shown in Table 5, and aqueous ammonia or hydrochloric acid was used for adjustment.

The patterned wafer polishing performance was evaluated. As a result, as shown in Table 6, the slurries for CMP of Comparative Examples 7-12 showed a high step height increment and a high concave part film thickness decrement of pattern (i) during overpolishing, and were inferior in the polishing suppressive effect and planarizing performance during overpolishing. Furthermore, as shown in Table 6, the slurries showed high pattern size dependent performance and high pattern density dependent performance in Comparative Examples 7 and 8. The slurries showed high pattern density dependent performance in Comparative Examples 9-12. They were inferior in the pattern-uniformizing performance.

TABLE 1

| | | Ex. 1 | Ex. 2 | Ex. 3 | Ex. 4 | Ex. 5 | Ex. 6 |
|---|---|---|---|---|---|---|---|
| abrasive grain (a) | kind | cerium oxide | cerium oxide | cerium oxide | cerium oxide | cerium oxide | cerium oxide |
| | concentration | 0.5 mass % | 0.5 mass % | 0.5 mass % | 0.5 mass % | 0.5 mass % | 0.3 mass % |
| compound (b) | kind | N-methyl glucamine (molecular weight 195) | N-methyl glucamine (molecular weight 195) | N-ethyl glucamine (molecular weight 209) | N-methyl glucamine (molecular weight 195) | N-methyl glucamine (molecular weight 195) | N-methyl glucamine (molecular weight 195) |
| | amino group | 1 (secondary) | 1 (secondary) | 1 (secondary) | 1 (secondary) | 1 (secondary) | 1 (secondary) |
| | pKa | 9.5 | 9.5 | 9.5 | 9.5 | 9.5 | 9.5 |
| | hydroxyl group | 5 | 5 | 5 | 5 | 5 | 5 |
| | concentration | 0.05 mass % | 0.05 mass % | 0.1 mass % | 0.01 mass % | 0.07 mass % | 0.008 mass % |
| polymer (c) | kind | polyacrylic acid (weight average molecular weight 5000) | polyacrylic acid (weight average molecular weight 5000) | polyacrylic acid (weight average molecular weight 5000) | polyvinyl pyrrolidone (weight average molecular weight 10000) | pullulan (weight average molecular weight 50000) | — |
| | concentration | 0.25 mass % | 0.25 mass % | 0.18 mass % | 0.015 mass % | 0.4 mass % | — |
| compound (d) | kind | — | ethylenediamine-N,N,N',N'-tetraacetic acid | — | — | ethylenediamine-N,N,N',N'-tetraacetic acid | — |
| | concentration | — | 0.03 mass % | — | — | 0.04 mass % | — |
| slurry pH | | 5.0 | 5.0 | 5.0 | 9.0 | 6.5 | 9.0 |

TABLE 2

|  |  |  | Ex. 1 | Ex. 2 | Ex. 3 | Ex. 4 | Ex. 5 | Ex. 6 |
| --- | --- | --- | --- | --- | --- | --- | --- | --- |
| just polishing | required time |  | 171 sec | 185 sec | 169 sec | 236 sec | 254 sec | 296 sec |
|  | pattern (i) | convex part silicon nitride film thickness (1) | 110 nm | 109 nm | 110 nm | 110 nm | 110 nm | 111 nm |
|  |  | concave part silicon oxide film thickness (2) | 518 nm | 520 nm | 520 nm | 516 nm | 513 nm | 515 nm |
|  |  | step height (3) | 15 nm | 15 nm | 15 nm | 20 nm | 20 nm | 20 nm |
| overpolishing (30%) | pattern (i) | convex part silicon nitride film thickness (1') | 106 nm | 105 nm | 104 nm | 101 nm | 104 nm | 100 nm |
|  |  | concave part silicon oxide film thickness (2') | 501 nm | 507 nm | 497 nm | 501 nm | 493 nm | 491 nm |
|  |  | step height (3') | 30 nm | 25 nm | 35 nm | 30 nm | 30 nm | 30 nm |
|  | pattern (ii) | convex part silicon nitride film thickness | 106 nm | 105 nm | 104 nm | 101 nm | 103 nm | 98 nm |
|  |  | concave part silicon oxide film thickness (4) | 505 nm | 509 nm | 505 nm | 503 nm | 509 nm | 502 nm |
|  | pattern (iii) | convex part silicon nitride film thickness | 108 nm | 106 nm | 105 nm | 102 nm | 105 nm | 101 nm |
|  |  | concave part silicon oxide film thickness (5) | 499 nm | 504 nm | 491 nm | 476 nm | 487 nm | 469 nm |
|  | pattern (iv) | convex part silicon nitride film thickness | 109 nm | 109 nm | 106 nm | 106 nm | 104 nm | 111 nm |
|  |  | concave part silicon oxide film thickness (6) | 514 nm | 512 nm | 514 nm | 508 nm | 516 nm | 522 nm |
|  | pattern (v) | convex part silicon nitride film thickness | 106 nm | 103 nm | 105 nm | 93 nm | 98 nm | 90 nm |
|  |  | concave part silicon oxide film thickness (7) | 491 nm | 496 nm | 487 nm | 489 nm | 501 nm | 493 nm |
|  | convex part film thickness decrement [(1) − (1')] |  | 4 nm | 4 nm | 6 nm | 9 nm | 6 nm | 11 nm |
|  | concave part film thickness decrement [(2) − (2')] |  | 17 nm | 13 nm | 23 nm | 15 nm | 20 nm | 24 nm |
|  | step height increment [(3') − (3)] |  | 15 nm | 10 nm | 20 nm | 10 nm | 10 nm | 10 nm |
|  | pattern size dependent performance [(4) − (5)] |  | 6 nm | 5 nm | 14 nm | 27 nm | 22 nm | 33 nm |
|  | pattern density dependent performance [(6) − (7)] |  | 23 nm | 16 nm | 27 nm | 19 nm | 15 nm | 29 nm |

TABLE 3

|  |  | Comp. Ex. 1 | Comp. Ex. 2 | Comp. Ex. 3 | Comp. Ex. 4 | Comp. Ex. 5 | Comp. Ex. 6 |
| --- | --- | --- | --- | --- | --- | --- | --- |
| abrasive grain (a) | kind | cerium oxide | cerium oxide | cerium oxide | cerium oxide | cerium oxide | cerium oxide |
|  | concentration | 0.5 mass % | 0.5 mass % | 0.5 mass % | 0.5 mass % | 0.5 mass % | 0.5 mass % |
| amino group containing compound | kind | tris(hydroxy-methyl)-aminomethane (molecular weight 121) | glucosamine (molecular weight 179) | bis(2-hydroxy-ethyl)aminotris-(hydroxymethyl)-methane (molecular weight 209) | — | — | — |
|  | amino group | 1 (primary) | 1 (primary) | 1 (tertiary) | — | — | — |
|  | pKa | 8.2 | 7.6 | 6.5 | — | — | — |
|  | hydroxyl group | 3 | 4 | 5 | — | — | — |
|  | concentration | 0.05 mass % | 0.05 mass % | 0.05 mass % | — | — | — |
| polymer (c) | kind | polyacrylic acid (weight average molecular weight 5000) | polyacrylic acid (weight average molecular weight 5000) | polyacrylic acid (weight average molecular weight 5000) | polyacrylic acid (weight average molecular weight 5000) | polyacrylic acid (weight average molecular weight 5000) | polyacrylic acid (weight average molecular weight 5000) |
|  | concentration | 0.25 mass % | 0.25 mass % | 0.25 mass % | 0.25 mass % | 0.25 mass % | 0.25 mass % |

TABLE 3-continued

|  |  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|
| compound (d) | kind | — | — | — | ethylenediamine-N,N,N',N'-tetraacetic acid | — | — |
|  | concentration | — | — | — | 0.05 mass % | — | — |
| other compound | kind | — | — | — | — | sorbitol | — |
|  | hydroxyl group | — | — | — | — | 6 | — |
|  | concentration | — | — | — | — | 0.1 mass % | — |
| slurry pH |  | 5.0 | 5.0 | 5.0 | 5.0 | 5.0 | 5.0 |

TABLE 4

|  |  |  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| just polishing | required time |  | 175 sec | 201 sec | 238 sec | 178 sec | 163 sec | 161 sec |
|  | pattern (i) | convex part silicon nitride film thickness (1) | 110 nm | 110 nm | 111 nm | 110 nm | 109 nm | 110 nm |
|  |  | concave part silicon oxide film thickness (2) | 506 nm | 508 nm | 510 nm | 513 nm | 510 nm | 511 nm |
|  |  | step height (3) | 25 nm | 25 nm | 25 nm | 20 nm | 20 nm | 20 nm |
| overpolishing (30%) | pattern (i) | convex part silicon nitride film thickness (1') | 103 nm | 101 nm | 103 nm | 103 nm | 100 nm | 102 nm |
|  |  | concave part silicon oxide film thickness (2') | 447 nm | 457 nm | 464 nm | 464 nm | 435 nm | 426 nm |
|  |  | step height (3') | 80 nm | 70 nm | 65 nm | 65 nm | 85 nm | 90 nm |
|  | pattern (ii) | convex part silicon nitride film thickness | 103 nm | 101 nm | 101 nm | 102 nm | 100 nm | 102 nm |
|  |  | concave part silicon oxide film thickness (4) | 474 nm | 470 nm | 472 nm | 467 nm | 452 nm | 439 nm |
|  | pattern (iii) | convex part silicon nitride film thickness | 105 nm | 103 nm | 100 nm | 104 nm | 101 nm | 103 nm |
|  |  | concave part silicon oxide film thickness (5) | 418 nm | 453 nm | 444 nm | 440 nm | 426 nm | 409 nm |
|  | pattern (iv) | convex part silicon nitride film thickness | 108 nm | 105 nm | 102 nm | 105 nm | 109 nm | 110 nm |
|  |  | concave part silicon oxide film thickness (6) | 501 nm | 487 nm | 485 nm | 482 nm | 457 nm | 455 nm |
|  | pattern (v) | convex part silicon nitride film thickness | 104 nm | 99 nm | 99 nm | 96 nm | 102 nm | 101 nm |
|  |  | concave part silicon oxide film thickness (7) | 437 nm | 455 nm | 436 nm | 408 nm | 380 nm | 370 nm |
|  | convex part film thickness decrement [(1) − (1')] |  | 7 nm | 9 nm | 8 nm | 7 nm | 9 nm | 8 nm |
|  | concave part film thickness decrement [(2) − (2')] |  | 59 nm | 51 nm | 46 nm | 49 nm | 75 nm | 85 nm |
|  | step height increment [(3') − (3)] |  | 55 nm | 45 nm | 40 nm | 45 nm | 65 nm | 70 nm |
|  | pattern size dependent performance [(4) − (5)] |  | 56 nm | 17 nm | 28 nm | 27 nm | 26 nm | 30 nm |
|  | pattern density dependent performance [(6) − (7)] |  | 64 nm | 32 nm | 49 nm | 74 nm | 77 nm | 85 nm |

TABLE 5

|  |  | Comp. Ex. 7 | Comp. Ex. 8 | Comp. Ex. 9 | Comp. Ex. 10 | Comp. Ex. 11 | Comp. Ex. 12 |
| --- | --- | --- | --- | --- | --- | --- | --- |
| abrasive grain (a) | kind | cerium oxide | cerium oxide | cerium oxide | cerium oxide | cerium oxide | cerium oxide |
|  | concentration | 0.5 mass % | 0.5 mass % | 0.5 mass % | 0.5 mass % | 0.5 mass % | 0.3 mass % |
| amino group containing compound | kind | trishydroxymethyl-aminomethane (molecular weight 121) | 2-(butylamino)-ethanol (molecular weight 117) | piperazine (molecular weight 86) | — | — | triethanol-amine (molecular weight 144) |
|  | amino group | 1 (primary) | 1 (secondary) | 2 (secondary) | — | — | 1 (tertiary) |
|  | pKa | 8.2 | 10.0 | 5.3, 9.7 | — | — | 7.9 |
|  | hydroxyl group | 3 | 1 | 0 | — | — | 3 |
|  | concentration | 0.05 mass % | 0.05 mass % | 0.05 mass % | — | — | 0.02 mass % |
| polymer (c) | kind | polyvinyl pyrrolidone (weight average molecular weight 10000) | polyvinyl pyrrolidone (weight average molecular weight 10000) | polyvinyl pyrrolidone (weight average molecular weight 10000) | polyvinyl pyrrolidone (weight average molecular weight 10000) | pullulan (weight average molecular weight 50000) | — |
|  | concentration | 0.015 mass % | 0.015 mass % | 0.015 mass % | 0.015 mass % | 0.4 mass % | — |
| compound (d) | kind | — | — | — | — | ethylenediamine-N,N,N',N'-tetraacetic acid | — |
|  | concentration | — | — | — | — | 0.04 mass % | — |
| slurry pH |  | 9.0 | 9.0 | 9.0 | 9.0 | 6.5 | 9.0 |

TABLE 6

|  |  |  | Comp. Ex. 7 | Comp. Ex. 8 | Comp. Ex. 9 | Comp. Ex. 10 | Comp. Ex. 11 | Comp. Ex. 12 |
| --- | --- | --- | --- | --- | --- | --- | --- | --- |
| just polishing | required time |  | 227 sec | 224 sec | 245 sec | 213 sec | 220 sec | 277 sec |
|  | pattern (i) | convex part silicon nitride film thickness (1) | 109 nm | 110 nm | 111 nm | 110 nm | 110 nm | 110 nm |
|  |  | concave part silicon oxide film thickness (2) | 512 nm | 508 nm | 503 nm | 515 nm | 501 nm | 504 nm |
|  |  | step height (3) | 20 nm | 25 nm | 30 nm | 15 nm | 30 nm | 25 nm |
| overpolishing (30%) | pattern (i) | convex part silicon nitride film thickness (1') | 83 nm | 76 nm | 54 nm | 35 nm | 104 nm | 44 nm |
|  |  | concave part silicon oxide film thickness (2') | 460 nm | 451 nm | 395 nm | 399 nm | 426 nm | 390 nm |
|  |  | step height (3') | 50 nm | 50 nm | 85 nm | 65 nm | 95 nm | 75 nm |
|  | pattern (ii) | convex part silicon nitride film thickness | 77 nm | 79 nm | 43 nm | 31 nm | 95 nm | 44 nm |
|  |  | concave part silicon oxide film thickness (4) | 473 nm | 471 nm | 398 nm | 408 nm | 429 nm | 399 nm |
|  | pattern (iii) | convex part silicon nitride film thickness | 90 nm | 77 nm | 55 nm | 44 nm | 106 nm | 46 nm |
|  |  | concave part silicon oxide film thickness (5) | 426 nm | 408 nm | 365 nm | 379 nm | 404 nm | 378 nm |
|  | pattern (iv) | convex part silicon nitride film thickness | 110 nm | 100 nm | 64 nm | 56 nm | 107 nm | 63 nm |
|  |  | concave part silicon oxide film thickness (6) | 475 nm | 482 nm | 460 nm | 424 nm | 466 nm | 445 nm |
|  | pattern (v) | convex part silicon nitride film thickness | 24 nm | 29 nm | 35 nm | 0 nm | 88 nm | 21 nm |
|  |  | concave part silicon oxide film thickness (7) | 361 nm | 395 nm | 376 nm | 288 nm | 392 nm | 327 nm |

TABLE 6-continued

|  | Comp. Ex. 7 | Comp. Ex. 8 | Comp. Ex. 9 | Comp. Ex. 10 | Comp. Ex. 11 | Comp. Ex. 12 |
|---|---|---|---|---|---|---|
| convex part film thickness decrement [(1) − (1')] | 26 nm | 34 nm | 57 nm | 75 nm | 6 nm | 66 nm |
| concave part film thickness decrement [(2) − (2')] | 52 nm | 57 nm | 108 nm | 116 nm | 75 nm | 114 nm |
| step height increment [(3') − (3)] | 30 nm | 25 nm | 55 nm | 50 nm | 65 nm | 50 nm |
| pattern size dependent performance [(4) − (5)] | 47 nm | 63 nm | 33 nm | 29 nm | 25 nm | 21 nm |
| pattern density dependent performance [(6) − (7)] | 114 nm | 87 nm | 84 nm | 136 nm | 74 nm | 118 nm |

As is clear from Table 1 and Table 2, the step height increment and concave part film thickness decrement were small during overpolishing and an influence of pattern shape was small in the Examples using the slurry for CMP of the present invention. On the other hand, as shown in Tables 3-6, the step height increment and concave part film thickness decrement were high during overpolishing, and an influence of pattern shape was also high in the Comparative Examples using slurry for CMP without containing compound (b).

INDUSTRIAL APPLICABILITY

As described in detail in the above, the present invention provides a slurry for CMP applicable to polishing of silicon oxide film formed on a semiconductor substrate, and production processes of various semiconductor devices, and CMP using the slurry. The slurry for CMP of the present invention is particularly suitable for polishing in a step for forming a shallow trench isolation (STI formation step), can afford, in the STI formation step, a polished film having an extremely small step height between the insulating film and the stop film, and can improve the yield of semiconductor substrate production.

This application is based on a patent application No. 2012-123472 filed in Japan, the contents of which are incorporated in full herein.

EXPLANATION OF SYMBOLS 1 substrate
2 oxidized insulating film (silicon oxide and the like)
3 stop film (silicon nitride and the like)
4 trench
5 insulating film (silicon oxide and the like)
6 STI region
h step height
t thickness of insulating film

The invention claimed is:
1. A slurry for chemical mechanical polishing, comprising abrasive grain (a),
compound (b) comprising an amino group having a pKa of more than 9, and not less than 3 hydroxyl groups, and
water.
2. The slurry according to claim 1, wherein
a concentration of the abrasive grain (a) is 0.1-20 mass %, and
a concentration of the compound (b) is 0.001-1 mass %.
3. The slurry according to claim 1, wherein the abrasive grain (a) is at least one selected from the group consisting of cerium oxide, manganese oxide, iron oxide, titanium oxide, magnesium oxide, zirconium oxide and tantalum oxide.
4. The slurry according to claim 1, wherein the pKa of the amino group of the compound (b) is 9.2-10.5.
5. The slurry according to claim 1, wherein the compound (b) comprises one amino group.
6. The slurry according to claim 1, wherein the compound (b) has a molecular weight of 100-1000.
7. The slurry according to claim 1, wherein the compound (b) is glucamine and/or a derivative thereof.
8. The slurry according to claim 1, further comprising a water-soluble polymer (c) at a concentration of 0.001-5 mass %.
9. The slurry according to claim 8, wherein the water-soluble polymer (c) is an anionic polymer and/or a non-ionic polymer.
10. The slurry according to claim 8, wherein the water-soluble polymer (c) is at least one selected from the group consisting of
a water-soluble polymer (c1) obtained by polymerizing 25-100 mass % of at least one monomer selected from the group consisting of (meth)acrylic acid, maleic acid, itaconic acid and vinylpyrrolidone, and 75-0 mass % of other monomer comprising an unsaturated double bond;
a water-soluble polymer (c2) obtained by polymerizing 50-100 mass % of a monomer that forms a vinyl alcohol skeleton by hydrolysis and 50-0 mass % of other monomer comprising an unsaturated double bond, which is followed by hydrolysis;
a water-soluble polysaccharide (c3);
a water-soluble polyurethane (c4) comprising a carboxy group and/or a polyoxyethylene group; and
a water-soluble derivative thereof (c5).
11. The slurry according to claim 1, further comprising a compound (d) comprising a structure of formula (1) or (2) at a concentration of 0.0001-1 mass % wherein $R^1$, $R^2$ and $R^3$ are each independently an alkylene group comprising 1-6 carbon atoms,
$R^4$ is a hydrogen atom or an alkyl group comprising 1-3 carbon atoms, and
n is an integer of 0-9.

12. The slurry according to claim 11, wherein the compound (d) is at least one selected from the group consisting of iminodiacetic acid, N-(2-hydroxyethyl)iminodiacetic acid, aspartic acid-N,N-diacetic acid, nitrilotriacetic acid, N-(2-hydroxyethyl)ethylenediamine-N,N',N'-triacetic acid, ethylenediamine-N,N,N',N'-tetraacetic acid, propylenediamine-N,N,N',N'-tetraacetic acid, glycol etherdiamine-N,N,N',N'-tetraacetic acid, 1,2-diaminocyclohexane-N,N,N',N'-tetraacetic acid, diethylenetriamine-N,N,N',N'',N''-pentaacetic acid, triethylenetetramine-N,N,N',N'',N''',N'''-hexaacetic acid, 3-hydroxy-2,2'-iminodisuccinic acid and ethylenediamine disuccinic acid.

13. The slurry according to claim 1, having pH of 3-11.

14. A method of chemical mechanical polishing, the method comprising polishing an insulating film by using the slurry according to claim 1.

15. The method according to claim 14, wherein a shallow trench isolation is formed.

\* \* \* \* \*